United States Patent
Mate

(10) Patent No.: US 8,311,242 B2
(45) Date of Patent: Nov. 13, 2012

(54) AMPLIFYING AN AUDIO SIGNAL

(75) Inventor: David Joseph Mate, Warwickshire (GB)

(73) Assignee: Red Lion 49 Limited, Begbroke (GB)

( * ) Notice: Subject to any disclaimer, the term of this patent is extended or adjusted under 35 U.S.C. 154(b) by 1848 days.

(21) Appl. No.: 11/508,399

(22) Filed: Aug. 23, 2006

(65) Prior Publication Data

US 2008/0008335 A1 Jan. 10, 2008

(30) Foreign Application Priority Data

Jul. 8, 2006 (GB) .................................. 0613605.5

(51) Int. Cl.
*H03F 99/00* (2009.01)
*H04R 3/00* (2006.01)

(52) U.S. Cl. ........... 381/120; 381/92; 381/122; 381/111

(58) Field of Classification Search .................. 381/120, 381/121, 110, 103, 104, 118, 92, 111, 122
See application file for complete search history.

(56) References Cited

U.S. PATENT DOCUMENTS

| | | | | |
|---|---|---|---|---|
| 3,985,978 A | * | 10/1976 | Cooper | 369/88 |
| 5,280,543 A | * | 1/1994 | Yokoyama et al. | 381/96 |
| 5,694,476 A | * | 12/1997 | Klippel | 381/96 |
| 6,057,737 A | * | 5/2000 | Pritchard | 330/300 |
| 2007/0076904 A1 | * | 4/2007 | Deruginsky et al. | 381/95 |

FOREIGN PATENT DOCUMENTS

JP 60121804 A * 6/1985

* cited by examiner

*Primary Examiner* — Devona Faulk
(74) *Attorney, Agent, or Firm* — Harness, Dickey & Pierce, P.L.C.

(57) ABSTRACT

A method of amplifying an output signal from a microphone or audio transducer so as to introduce a controllable degree of distortion for inputs having a wide dynamic range, comprising the steps of: receiving a differential input signal from a microphone or audio transducer, applying said differential signal to a differential amplifier, said differential amplifier having a negative feedback path to control the gain of said amplifier; and providing non-linear circuitry in said feedback path so as to introduce distortion, such that the degree of distortion present is related to the level of the output signal and not to the level of the input signal.

10 Claims, 6 Drawing Sheets

AMPLIFYING AN AUDIO SIGNAL

CROSS REFERENCE TO RELATED APPLICATION

This application claims priority from United Kingdom Patent Application No. 0613605.5, filed Jul. 8$^{th}$, 2006, the entire disclosure of which is incorporated herein by reference in its entirety.

TECHNICAL FIELD

The present invention relates to a method of amplifying an output signal from a microphone or audio transducer. The invention also relates to amplifying apparatus for amplifying an output signal for a microphone or an audio transducer and to an audio mixing apparatus configured to receive multiple inputs from microphones and other audio sources.

BACKGROUND OF THE INVENTION

Over recent years, there has been a trend towards processing audio signals in the digital domain, in which an analogue input signal is digitized by an analogue to digital converter, processed (possibly in a digital signal processing environment) and then converted back from a digital signal in to an analogue output signal. However, in parallel with this trend, demand also exists for purely analogue processing systems in which audio signals continue to be represented as analogue voltages and analogue processing is performed upon these voltage signals.

A characteristic of early amplification systems is that they tend to introduce a degree of distortion. Distortion is brought about by the existence of non-linear elements and processes within the system therefore the presence of these non-linearities, when considered in the frequency domain, results in the introduction of new frequency components, these being harmonics of the original component frequencies.

Poor quality bipolar transistor amplifiers have a tendency to introduce third harmonic distortion, also referred to as symmetrical distortion. The resulting harmonics are not musically related to the originating frequencies therefore the distortion is perceived as being unpleasant. However, some types of amplification system, including early vacuum tube based amplification systems, introduce even harmonic distortion in which the resulting harmonics are musically related to the originating frequencies. Under these circumstances the resulting distortion is not unpleasant and some musicians prefer the introduction of this type of distortion, as they consider the undistorted amplification process to be less tasteful and somewhat "cold".

Given the potential desirability of even harmonic distortion, particularly in analogue systems, attempts have been made to recreate the distortion so that the presence of the distortion and the degree of the distortion may be selected in accordance with a performer's taste.

Known procedures for introducing distortion through an amplification process often involve overloading the input stages of the amplifier. Thus, distortion may be introduced by increasing the level of the input signal. Consequently, input stages of the amplification process are overloaded, introducing a desired distortion, whereafter the distorted signal is further amplified to produce the required output. Such an approach is adopted in many guitar amplification systems.

A problem with the amplification of signals originating from microphones and similar audio transducers is that the level of the input signal can vary significantly compared to, say, output signals generated by electric guitar pickups. For example, a microphone placed near to a drum will produce a relatively high signal whereas a microphone situated in a room to collected ambient sounds will produce a very low signal. A problem therefore exists in terms of introducing variable levels of distortion without being dependent upon the level of the input signal.

BRIEF SUMMARY OF THE INVENTION

According to an aspect of the present invention, there is provided a method of amplifying an output signal from a microphone or audio transducer so as to introduce a controllable degree of distortion for inputs having a wide dynamic range, comprising the steps of:

receiving a differential input signal from a microphone or audio transducer; applying said differential signal to a differential amplifier, said differential amplifier having a negative feedback path to control the gain of said amplifier; and providing non-linear circuitry in said feedback path so as to introduce distortion, such that the degree of distortion present is related to the level of the output signal and not to the level of the input signal.

DESCRIPTION OF THE BEST MODE FOR CARRYING OUT THE INVENTION

FIG. 1

Figure 1:
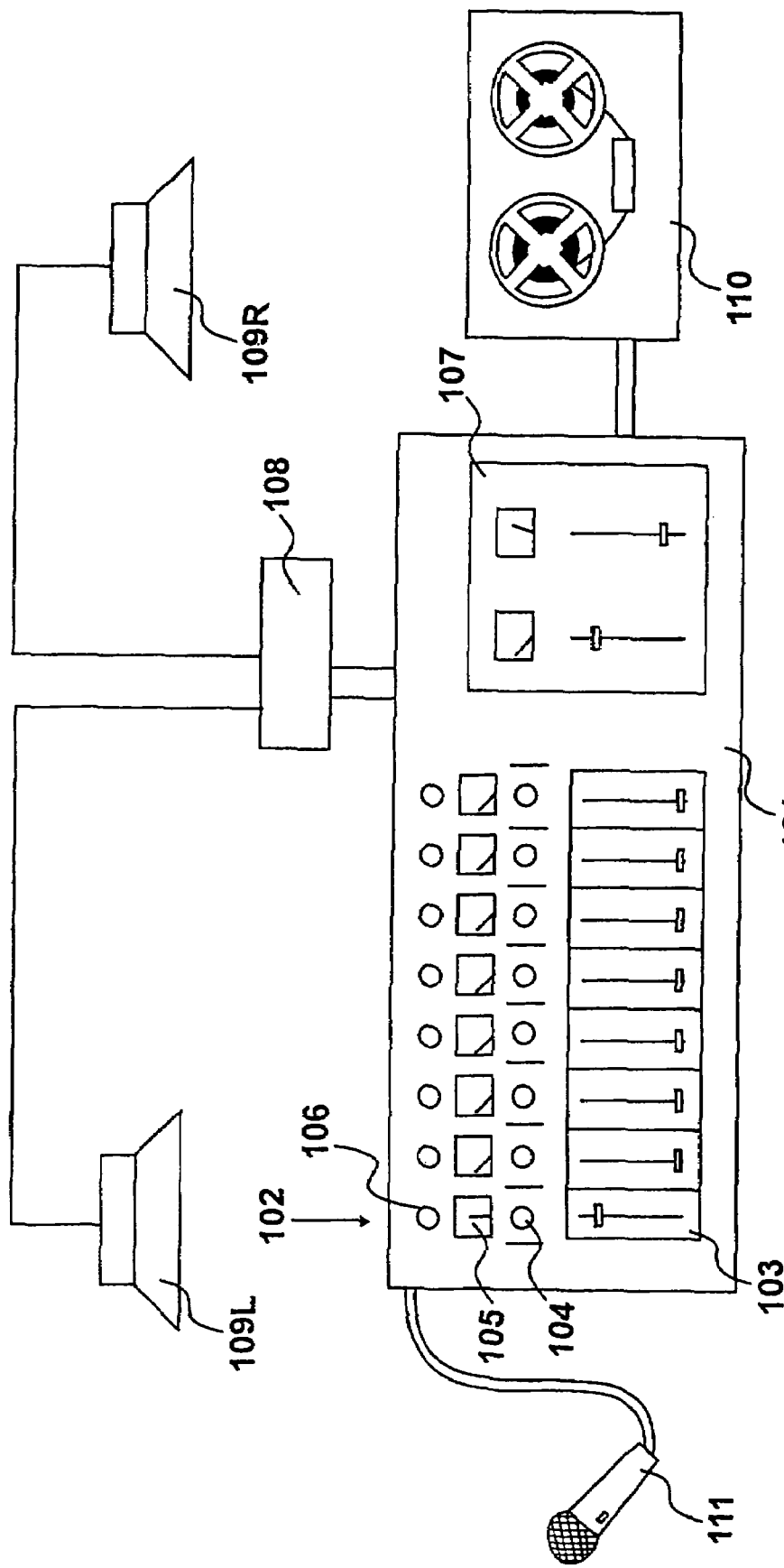
FIG. 1 shows an analogue audio recording environment.

An analogue audio recording environment is illustrated in FIG. 1. The environment includes an analogue mixing desk or console 101 in which all signal processing is performed in the analogue domain, where signals continue to be represented as analogue voltages and/or currents. In this example, the mixing desk 101 has eight input channels, although many professional mixing desks of this type will include substantially more. Control and monitoring equipment for each specific channel is laid out substantially vertically and a collection of these components for a particular channel is often referred to as a channel strip. Thus, in the example shown in FIG. 11 eight channel strips, such as strip 102, are present. In this example, each channel strip includes an input volume control 103, a pan control 104 and a level indicator 105; all of which are known and represent conventional equipment in channel strips of this type. In addition, each channel strip is provided with a distortion control 106, the operation of which activates distortion introducing circuitry and allows the level of distortion to be controlled.

In addition to these input controls, output sliders for the left and right channel outputs and similar monitoring units are included within an output section 107, again of conventional design. The output section provides a monitoring output to an amplifier 108 that in turn drives monitoring speakers 109L and 109R. In addition, a further stereo output is provided to an audio recording device 110, such as an analogue tape recorder.

In this example, an analogue input is being generated by a microphone 111 that produces a differential signal that is supplied to an input of the mixing desk 101. The signal is balanced such that an output from the microphone 111 results in a first connection being pushed in a positive direction while the second connection is pulled in a negative direction.

FIG. 2

Figure 2:
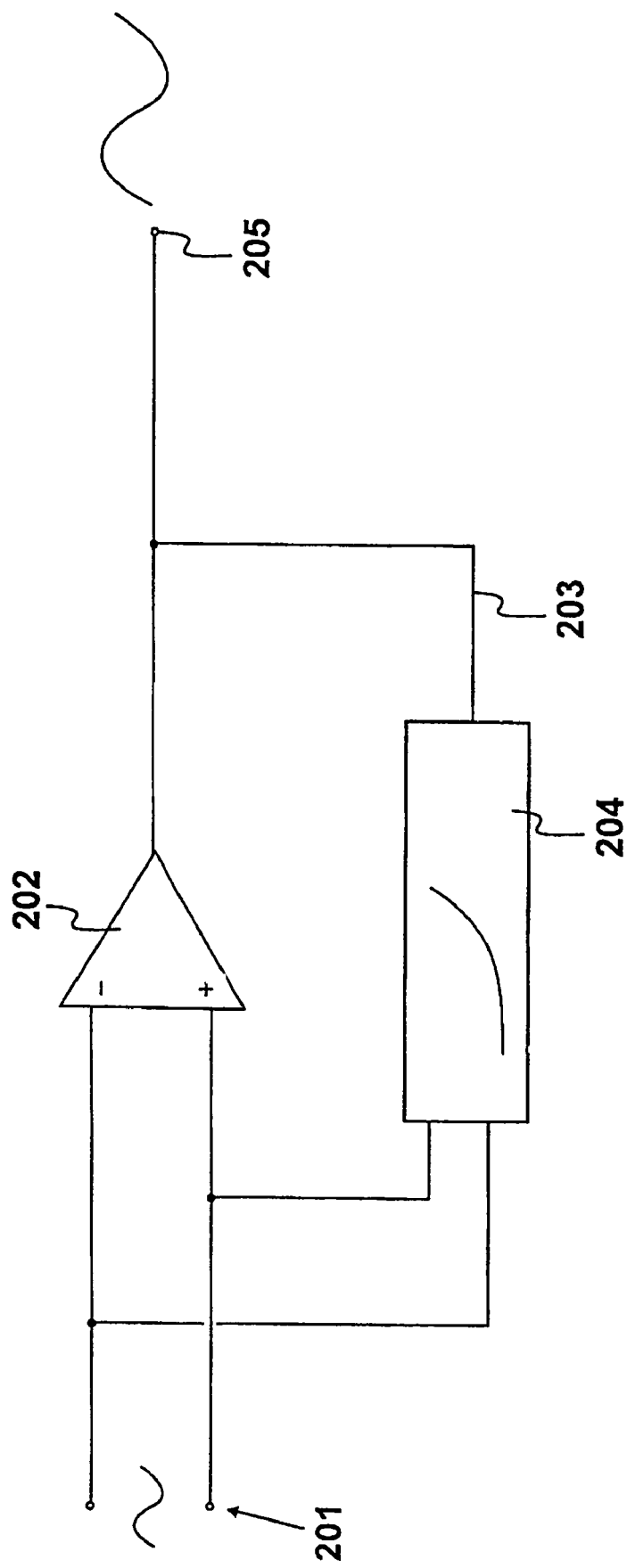
FIG. 2 shows a schematic representation of an approach adopted by a preferred embodiment.

A schematic representation of an approach adopted by a preferred embodiment is illustrated in FIG. 2. A differential input signal is received from a microphone or an audio transducer, represented by input terminals 201. The differential signal is supplied to a differential amplifier 202, the differential amplifier having a negative feedback path 203 to control the gain of the amplifier 202. Furthermore, the negative feedback path includes non-linear circuitry 204 so as to introduce distortion, such that the degree of distortion present is related to the level of the output signal at an output terminal 205 and not to the level of the input signal at input terminals 201.

FIG. 3

Figure 3:
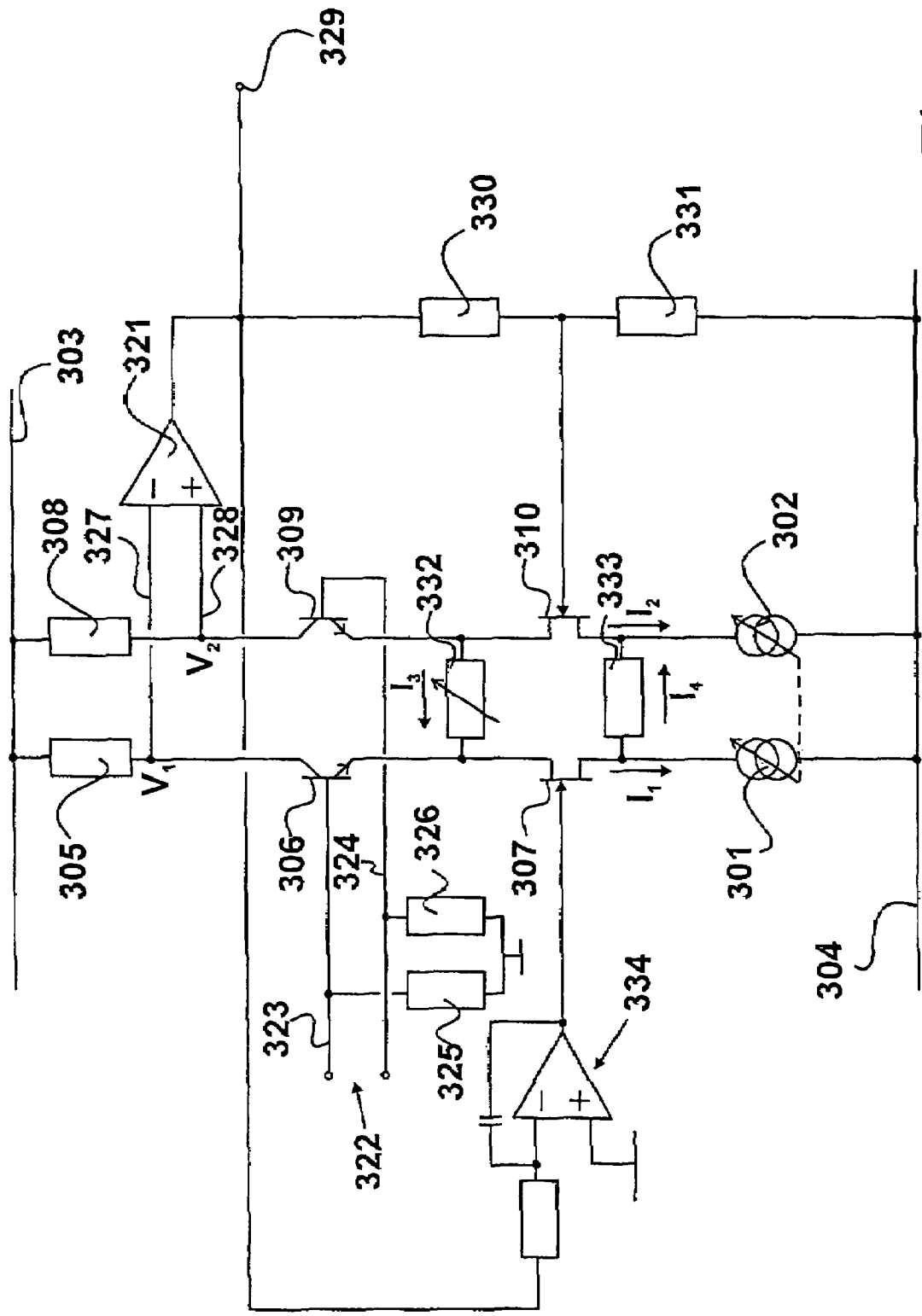
FIG. 3 shows a practical realisation of the approach identified in FIG. 2.

A practical approach to the proposal for a preferred embodiment is illustrated in FIG. 3. The circuit includes a first constant current source 301 and a second constant current source 302. These establish two equal current paths from a positive supply rail 303 to a negative supply rail 304; in accordance with the notion of conventional current.

From the positive supply rail 303, the first current path includes a resistor 305 connected to the collector of an NPN bipolar transistor 306. The path continues by the emitter of transistor 306 being connected to the source of a field effect transistor (preferably a junction field effect transistor) 307, the drain of which is connected to the constant current source 301 that is in turn connected to the negative supply rail.

The second current path is substantially similar to the first, consisting of a resistor 308 connected between the positive supply rail 303 and the collector of a second bipolar transistor 309. Similarly, the emitter of transistor 309 is connected to the source of a second field effect transistor 310, and the drain of FET 310 is connected to the constant current source that is in turn connected to the negative supply rail 304.

An operational amplifier 321 provides substantially the functionality of the differential amplifier 202 shown in FIG. 2. Differential input signals, received as an output signal from the microphone or transducer, are shown at 322. A first of these inputs 323 is connected to the base of bipolar transistor 306 and the second input 324, of the differential pair, is supplied to the base of the second bipolar transistor 309. In addition, each input is connected to ground by a respective resistor 325 and 326.

The operational amplifier 321 includes a negative input 327 and a positive input 328. A negative input to the operational amplifier 321 is provided at a location between the first resistor 305 and the collector of transistor 306. Similarly, a positive input to amplifier 321 is received at a position between the second resistor 308 and the collector to the second transistor 309. An output from the operational amplifier 321 provides a main output 329 from this stage of the amplification process. Furthermore, the output from operational amplifier 321 is also used to complete the feedback loop by providing signals to the gate of FET 307 and to the gate of FET 310.

For FET 310, the output from amplifier 321 is directed to ground via a potential divider defined by resistors 330 and 331. Thus, the voltage appearing between these resistors 330 and 331 is directed towards the gate of FET 310.

For the second FET 307, the output from amplifier 321 is supplied via a DC servo circuit 334 having a time constant in the region of one to two seconds, prior to being supplied to the gate of FET 307. The DC servo circuit is provided so as to ensure that the output voltage at 329 tends towards zero when no input signal is being received.

A resistor 332 is positioned between the emitter of transistor 306 (also connected to the source of FET 307) and the emitter of transistor 309. A further resistor 333 is located between the drain of FET 307 (also connected to constant current source 301) and the drain of FET 310.

Current sources 301 and 302 are implemented using bipolar transistor circuitry in addition to a driving amplifier configured to control the amount of current flowing through the current sources and also compensating for temperature variation. In a preferred embodiment, currents $I_1$ and $I_2$ may lie within the range of 0.1 milli amp to 10 milli amp. With increased current flow, FETs 307 and 310 exhibit more linear characteristics thus, in order to increase the level of distortion provided by the circuitry, the constant currents $I_1$ and $I_2$ are reduced so as to place the operation of the FETs in a less linear region, typically exhibiting a square law characteristic.

Thus, initially, the currents $I_1$ and $I_2$ are equal. However, as a differential signal is applied at 322 a difference will occur in terms of voltages $V_1$ and $V_2$ applied across the inputs of the operation amplifier 321. The operational amplifier 321 is configured such that the application of these voltages produces negative feedback which will in turn attempt to make the voltages equal.

The differential voltages applied at 322 and hence supplied to the base terminals of transistors 306 and 309 result in modifications to emitter current of said transistors. Thus, for example, in response to a differential voltage at 322 it is possible for the current from the emitter of 309 to increase while the current from emitter of transistor 306 reduces. Under these circumstances, current $I_3$ will shunt across resistor 327.

As the shunting of current starts to take place, as described above, the feedback loop will attempt to rebalance the circuit. The feedback signal is supplied to the gate of FET 307 and to the gate of FET 310, as previously described. Configured as negative feedback, the current from the drain of FET 307 will increase, while the current from the drain of FET 310 will decrease, thereby resulting in the shunting of current $I_4$ through resistor 328. However, due to the non-linear characteristics of FETs 307 and 310, the flow of current $I_4$ will not behave in the same way as the flow of current $I_3$ such that the feedback characteristics are distorted with respect to the input signal thereby ensuring that the distorted characteristic is imposed upon the output at 329 in a controllable fashion.

Constant current sources 301 and 302 are made variable such that, as previously described, a reduction in the level of current flowing through the FETs 307 and 310 increases the non-linear characteristic.

In terms of overall gain, it can be shown that the gain is related to the ratio of the resistance of resistor 333 over the resistance of resistor 332. Thus, resistor 333 is made larger than resistor 332 so as to provide a level of gain for the amplification process as a whole. Furthermore, resistor 332 is made variable such that its resistance may be varied thereby providing gain control.

FIG. 4

Figure 4:
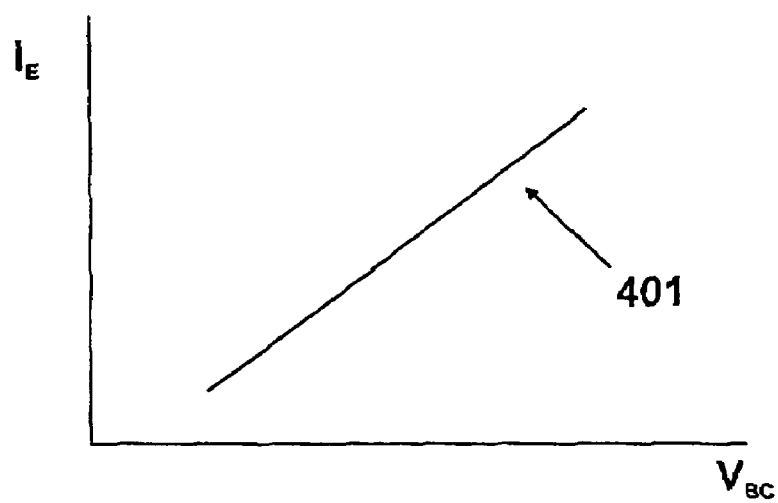
FIG. 4 shows characteristics of transistors identified in FIG. 3.
Figure 4:
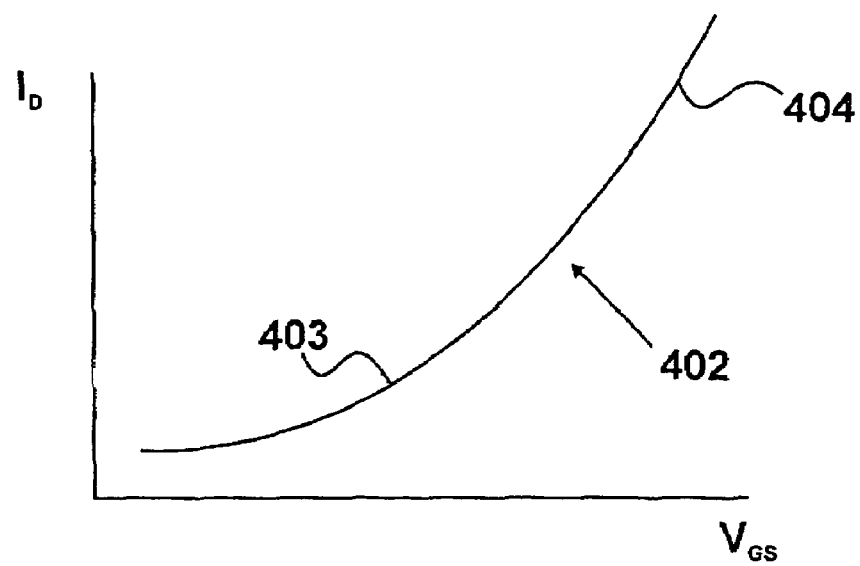

Characteristics of a linear transistor are illustrated in FIG. 4 at 401. Here it can be seen that emitter current $I_E$ varies substantially linearly with voltage $V_{BC}$, that is to say the voltage applied across the base and collector of these transistors.

The non-linear response of the FETs 307 and 310 is illustrated by curve 402, illustrating the relationship of the drain current $I_D$ with respect to a control voltage $V_{GS}$ applied across the gate and source of the transistor. As illustrated by curve 402 the response is very non-linear for low drain currents as shown at position 403, whereas the response becomes more linear as the drain current is increased as indicated at position 404.

FIG. 5

Figure 5:
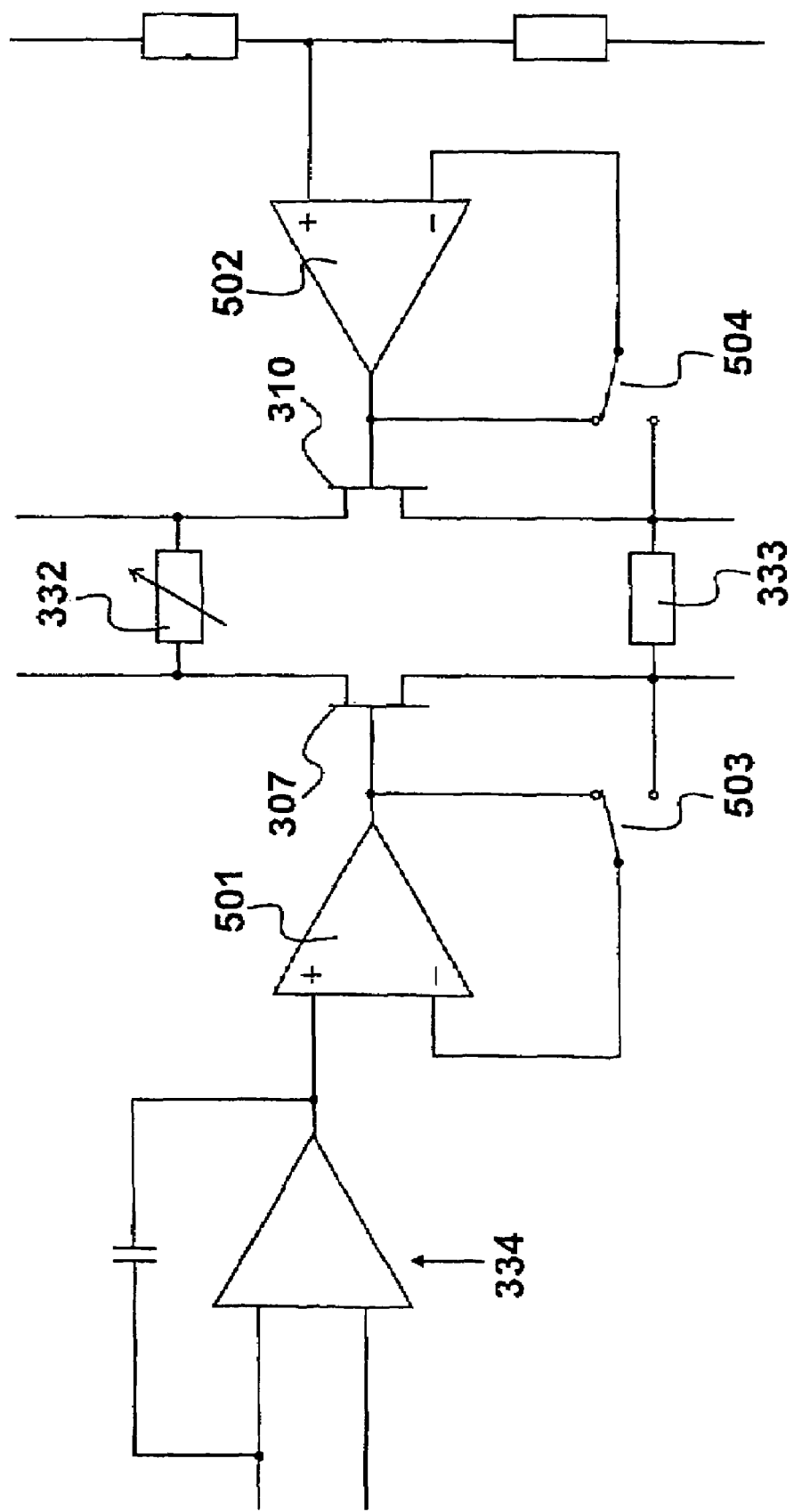
FIG. 5 shows an alternative embodiment of the present invention.

In addition to providing controllable distortion that is not dependent on the level of the input signal, the circuit shown in FIG. 3 also performs a function of converting the differential signals at inputs 322 to a single output at 329. However, although the degree of distortion is variable, even at its most minimum setting, a level of distortion is still present which, in many situations, would be considered undesirable. Thus, in an alternative embodiment, as detailed in FIG. 5, compensation is provided so as to compensate for this distortion when clean amplification is required. In FIG. 5, a first operational amplifier 501 is inserted between the DC servo circuit 334 and the gate to the FET 307. Thus, the signal that was previously supplied to the gate of FET 307 is supplied to the positive input of the operational amplifier 501 and the output from the operational amplifier is supplied to the gate of FET 307. A negative feedback signal is received at the negative input of the operational amplifier 501.

Similarly, an operational amplifier 502 receives, at its positive input, the signal that had been supplied to the gate of FET 310. The output from the operational amplifier 502 is supplied to the gate of FET 310 and a negative feedback signal is supplied to the negative input of operational amplifier 502. Ganged switches 503 and 504 allow a selection to be made as to where the feedback signal is derived from.

In the configuration shown in FIG. 5, switches 503 and 504 are in their upper position such that the operational amplifiers act as unity gain buffers and effectively introduce no changes to the circuit. Thus, under these conditions, distortion continues to be introduced as described above.

FIG. 6

Figure 6:
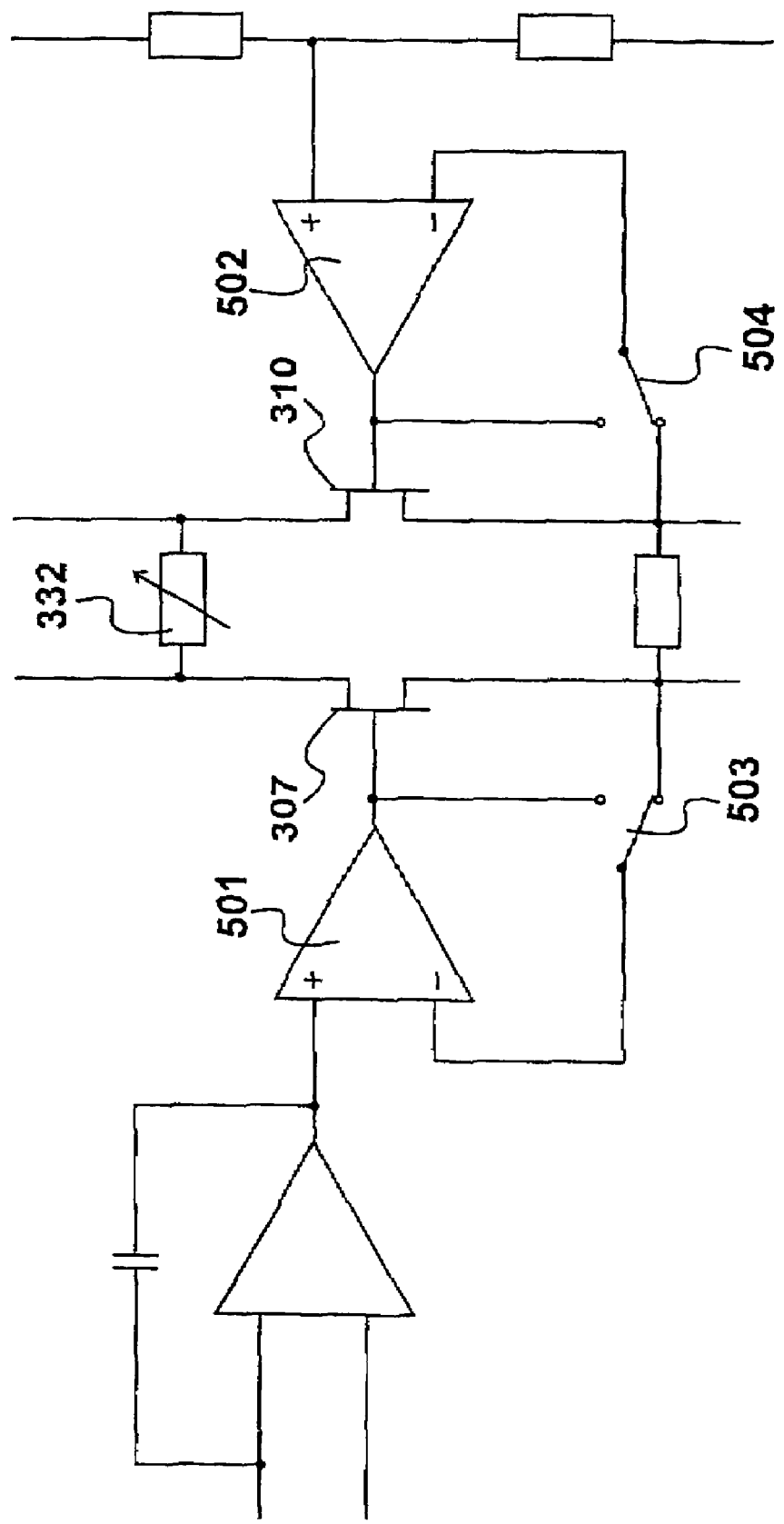
FIG. 6 shows the circuit of FIG. 5 in an alternative configuration.

FIG. 6 shows the circuit of FIG. 5 but with switches 503 and 504 switched over to their alternative configuration and thus placed in a lower condition. In this lower condition, the operational amplifiers force the source voltage of their respective FETs to follow the command voltage supplied to the gate of their respective FETs and thereby linearize the circuit. Thus, with switches 503 and 504 placed in their lower condition, as illustrated in FIG. 6, the operational amplifiers 501 and 502 substantially compensate for the non-linearity of the FETs 307 an 310 such that the performance of the circuit exhibits characteristics that are substantially similar to non-distorting microphone input stages. Thus, the operation of switches 503 and 504 allows the amplifier to be switched from a non-distorting condition into a distorting condition in which second harmonic distortion is introduced. Furthermore, the extent to which this distortion is introduced is controlled by varying the current generated by current sources 301 and 302. Furthermore, the overall gain of the amplifier is controlled by varying the resistance of resistor 332.

The invention claimed is:

1. A method comprising amplifying a differential signal produced by a microphone or an audio transducer so as to introduce a controllable degree of distortion, said method including steps of:

receiving a differential signal from a microphone or an audio transducer, said differential signal comprising two complementary parts;

applying the two complementary parts of said differential signal to an inverting input terminal and a non-inverting input terminal of a differential amplifier, said differential amplifier being configured to produce an output signal at an output terminal, and wherein said differential amplifier is provided with a negative feedback path between said output terminal and both said inverting input terminal and said non-inverting input terminal, thereby introducing into said differential signal a feedback signal related to said output signal, thus controlling the gain of said differential amplifier; and providing non-linear circuitry in said negative feedback path that introduce distortion in said feedback signal that is related to the level of said output signal.

2. A method according to claim 1, wherein the non-linearity of said non-linear circuitry is adjustable so as to control the extent to which distortion is introduced.

3. A method according to claim 1 or claim 2, further including a step of providing a compensation circuit for selectively compensating the non-linearity of said non-linear circuitry so as to substantially eliminate said distortion.

4. Amplifying apparatus, comprising:

an input configured to receive a differential signal produced by a microphone or an audio transducer, said differential signal comprising two complementary parts;

a differential amplifier having an inverting input terminal and a non-inverting input terminal to which the two complementary parts of said differential signal are applied, said differential amplifier being configured to amplify said differential signal to produce an output signal at an output terminal, and wherein said differential amplifier is provided with a negative feedback path between said output terminal and both said inverting input terminal and said non-inverting input terminal, whereby said negative feedback path is configured to introduce into said differential signal a feedback signal related to said output signal, thus controlling the gain of said differential amplifier; and non-linear circuitry in said negative feedback path configured to introduce controllable distortion in said feedback signal that is related to the level of said output signal.

5. Apparatus according to claim 4, further including a manually operable switch for selectively switching from substantially no distortion to a distorted operation.

6. Apparatus according to claim 5, wherein said switch is a relay, and said apparatus further comprises a relay-control switch configured to operate said relay after a short delay, and said relay control switch is also configured to operate a muting procedure so as to mute audible clicks as the relay is operated.

7. Apparatus according to claim 4, wherein the non-linear circuitry is configured to introduce even harmonic distortion.

8. Apparatus according to claim 7, wherein said non-linear circuitry comprises a pair of field effect transistors configured to operate under variable current conditions.

9. Apparatus according to claim 8, wherein an increase in the current supplied to said field effect transistors improves their linearity and the degree of distortion introduced to said feedback signal is increased by reducing current supplied to said field effect transistors.

10. Apparatus according to claim 9, wherein each input path is connected to a respective constant current feed back path, wherein each input signal is introduced by a linear element; and the feedback signal is split so as to be introduced to each constant current feedback path via a respective non-linear element.

* * * * *